United States Patent
Yang (10) Patent No.: US 9,312,867 B2
(45) Date of Patent: Apr. 12, 2016

(54) PHASE LOCK LOOP DEVICE WITH CORRECTING FUNCTION OF LOOP BANDWIDTH AND METHOD THEREOF

(71) Applicant: REALTEK SEMICONDUCTOR CORP., Hsinchu (TW)

(72) Inventor: Yu-Che Yang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/449,310

(22) Filed: Aug. 1, 2014

(65) Prior Publication Data

US 2015/0155877 A1 Jun. 4, 2015

(30) Foreign Application Priority Data

Dec. 4, 2013 (TW) .............................. 102144378 A (51) Int. Cl.
*H03L 7/06* (2006.01)
*H03L 7/085* (2006.01)

(52) U.S. Cl.
CPC ...................................... *H03L 7/085* (2013.01)

(58) Field of Classification Search
USPC .................................. 327/147–149, 156–158
See application file for complete search history.

(56) References Cited

U.S. PATENT DOCUMENTS

| 6,834,183 | B2 | 12/2004 | Black et al. |
| 7,259,633 | B2 | 8/2007 | Lee et al. |
| 7,522,690 | B2 | 4/2009 | Zhang |
| 7,746,956 | B2 | 6/2010 | Plevridis |
| 8,031,008 | B2 | 10/2011 | Wang et al. |
| 8,483,985 | B2 | 7/2013 | Stockstad et al. |
| 8,494,085 | B2 | 7/2013 | Plevridis |
| 2004/0066336 | A1* | 4/2004 | De Graauw .......... H01Q 9/0421 343/700 MS |
| 2005/0073369 | A1 | 4/2005 | Balboni et al. |
| 2008/0136532 | A1* | 6/2008 | Hufford .................. H03L 7/081 331/10 |
| 2009/0033383 | A1* | 2/2009 | Wyatt .................... H03L 7/0896 327/157 |
| 2009/0245306 | A1* | 10/2009 | Rakuljic ............... H01S 5/4006 372/29.011 |
| 2012/0319786 | A1* | 12/2012 | kumar ................... H03L 7/0896 331/1 R |
| 2013/0063192 | A1* | 3/2013 | Ferriss .................. H03L 7/0891 327/157 |
| 2015/0155877 | A1* | 6/2015 | Yang ....................... H03L 7/085 327/157 |

OTHER PUBLICATIONS

Wu et al., "Method for a Constant Loop Bandwidth in LC-VCO PLL Frequency Synthesizers", IEEE Journal of Solid-state Circuits, journal, Feb. 2009, p. 427-435, vol. 44 No. 2, IEEE, USA.
Ferriss et al., "An Integral Path Self-Calibration Scheme for a Dual-Loop PLL", IEEE Journal of Solid-state Circuits, journal, Apr. 2013, p. 996-1008, vol. 48 No. 4, IEEE, USA.
Fischette et al., "An Embedded All-Digital Circuit to Measure PLL Response", IEEE Journal of Solid-state Circuits, journal, Aug. 2010, p. 1492-1503, vol. 45 No. 8, IEEE, USA.
Taiwan Patent Office, Office Action issued on Oct. 26, 2015, Taiwan.

* cited by examiner

*Primary Examiner* — Adam Houston
(74) *Attorney, Agent, or Firm* — Rabin & Berdo, P.C.

(57) ABSTRACT

A phase lock loop (PLL) device with correcting function of loop bandwidth and method thereof is related to the method including generating an output signal by a PLL circuit according to a reference signal and a feedback signal, modulating a feedback coefficient to unlock the feedback signal and the reference signal, detecting two valid crossovers of a phase difference between the reference signal and the feedback signal, calculating an oscillation frequency according to the two valid crossovers, and setting a control parameter of the PLL circuit according to the oscillation frequency. The feedback signal is related to the output signal, and there is the feedback coefficient between the feedback signal and the output signal.

12 Claims, 8 Drawing Sheets

PHASE LOCK LOOP DEVICE WITH CORRECTING FUNCTION OF LOOP BANDWIDTH AND METHOD THEREOF

CROSS-REFERENCES TO RELATED APPLICATIONS

This non-provisional application claims priority under 35 U.S.C. §119(a) on Patent Application No. 102144378 filed in Taiwan, R.O.C. on Dec. 4, 2013, the entire contents of which are hereby incorporated by reference.

BACKGROUND

1. Technical Field

The present invention relates to a loop bandwidth correcting technology, and in particular, to a phase lock loop (PLL) device with correcting function of loop bandwidth and method thereof.

2. Related Art

A PLL is a typical technology for synthesizing a frequency signal, and is often used to design various frequency control loops for frequency tuning of radio waves or clock control of digital products.

Generally, in a PLL, input and output periodic signals have a specific phase relationship. A circuit structure of the PLL mainly includes a phase frequency detector (PFD), a charge pump, a loop filter, a voltage controlled oscillator (VCO), and a feedback unit.

A PLL generally operates as follows: an initial stage is a frequency acquisition stage, and in the frequency acquisition stage, an internal frequency catches up with 90% of a target frequency; after a difference between the internal frequency and the target frequency is within 10%, the PLL enters a frequency locking stage; in the frequency locking stage, a phase is acquired, and finally locking between the phase and the frequency is achieved. Different locked frequencies have different control voltages, reflecting different control parameters for the PLL, thus affecting stability.

Loop bandwidth of a PLL may affect a transient response, integrated phase noise (IPN), relative phase noise (RPN), inter-carrier interference (ICI), and other performance parameters of the PLL. To achieve optimal performance of the PLL, it is crucial to control the loop bandwidth of the PLL well. However, preset loop bandwidth usually changes under the effect of factors such as a change of a semiconductor process, a change of an external component, a change of a power supply, and environmental conditions, leading to a drift of the loop bandwidth.

Nowadays, many correcting technologies for loop bandwidth have been developed, however, they fails to respond to each loop operation result and limits architecture of the PLL, etc.

SUMMARY

In an embodiment, a PLL device with correcting function of loop bandwidth includes a PLL circuit and a correcting circuit.

The PLL circuit generates a control voltage according to a reference signal and a feedback signal, and generates an output signal according to the control voltage. The feedback signal is related to the output signal, and there is a feedback coefficient between the feedback signal and the output signal.

The correcting circuit modulates the feedback coefficient to unlock the feedback signal and the reference signal, calculates an oscillation frequency according to two valid crossovers of a phase difference between the reference signal and the feedback signal, and adjusts a control parameter of the PLL circuit according to the oscillation frequency.

In an embodiment, a method for correcting loop bandwidth is applicable to a PLL circuit. The method includes generating an output signal by the PLL circuit according to a reference signal and a feedback signal related to each other, modulating a feedback coefficient between the feedback signal and the output signal to unlock the feedback signal and the reference signal, detecting two valid crossovers of a phase difference between the reference signal and the feedback signal, calculating an oscillation frequency according to the two valid crossovers, and setting a control parameter of the PLL circuit according to the oscillation frequency.

As above, the PLL device with correcting function of loop bandwidth and method thereof according to the invention is applicable to various PLL apparatuses, to provide precise and digital correction for the loop bandwidth, and to be easily integrated in a single chip. The PLL device with correcting function of loop bandwidth and method thereof according to the present invention provides a correction technology that responds to a correction result, so as to avoid a performance change caused by related factors such as environmental conditions.

DETAILED DESCRIPTION

Figure 1:
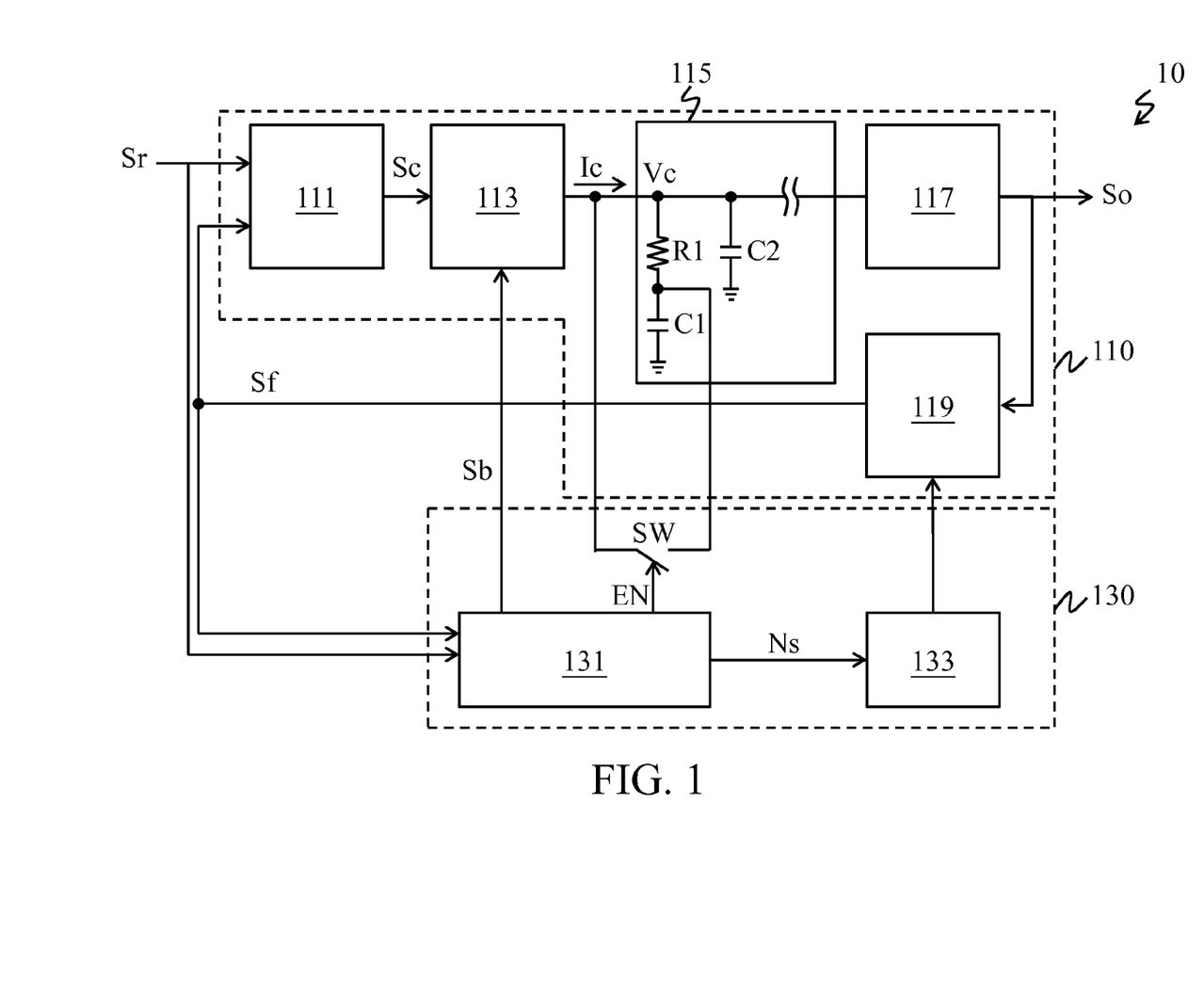
FIG. 1 is a schematic view of a PLL device according to a first embodiment of the invention.

Referring to FIG. 1, a PLL (phase lock loop) device 10 includes a PLL circuit 110 and a correcting circuit 130. The correcting circuit 130 applies to correcting the loop bandwidth of the PLL circuit 110. It should be noted that, the PLL circuit 110 in this embodiment may be a currently existing PLL circuit or a future developed circuit having similar functions, and persons skilled in the art should understand architecture and operating manners of these devices.

Using a single loop as an example, the PLL circuit 110 includes a PFD (phase frequency detector) 111, a charge pump 113, a loop filter 115, a VCO (voltage controlled oscillator) 117, and a frequency divider 119.

The PFD 111, charge pump 113, loop filter 115, VCO 117, and frequency divider 119 are electrically connected in sequence to form a loop. The loop filter 115 includes a resistor R1 and two capacitors C1 and C2. An output end of the charge pump 113 is electrically connected a first end of the resistor R1 and a first end of the capacitor C2. The capacitor C1 is electrically connected between a second end of the resistor R1 and a ground. A second end of the capacitor C2 is electrically connected to the ground.

Figure 2:
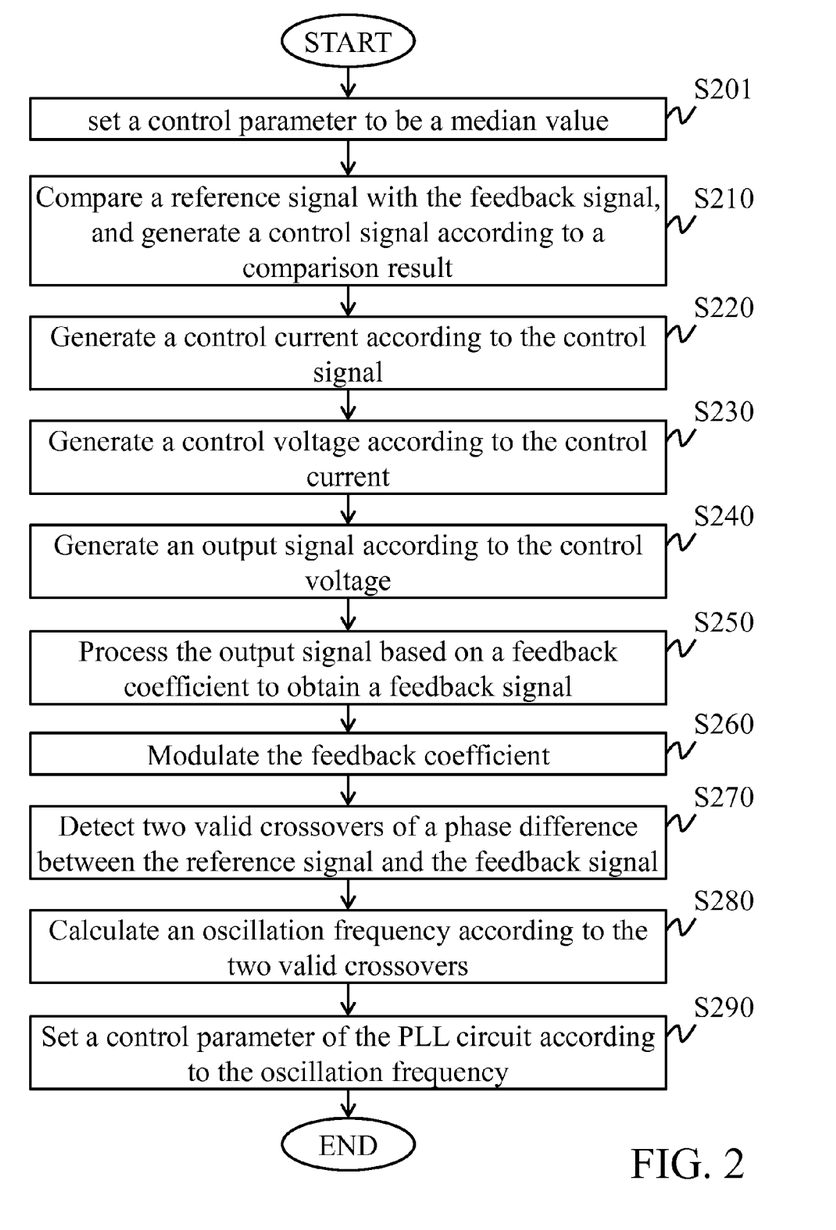
FIG. 2 is a flowchart of a method for correcting loop bandwidth according to a first embodiment of the invention.

FIG. 2 is a flowchart of a correcting method for loop bandwidth according to a first embodiment of the present invention. Referring to FIG. 2, a control parameter may be initially set to a median value in tolerance range of the PLL circuit 110 (Step S201). The PFD 111 receives a reference signal Sr and a feedback signal Sf. The PFD 111 compares the reference signal Sr with the feedback signal Sf, and generates a control signal Sc according to a comparison result (Step S210).

The charge pump 113 generates a control current Ic according to the control signal Sc (Step S220). The loop filter 115 generates a control voltage Vc according to the control current Ic (Step S230). At this time, the control current Ic either charges or discharges the capacitors C1 and C2 of the loop filter 115, and therefore the control voltage Vc is generated at the first end of the resistor R1.

The VCO 117 generates an output signal So according to the control voltage Vc (Step S240). The frequency divider 119 divides a frequency of the output signal So by a feedback coefficient (namely, a divisor) to obtain a feedback signal Sf, and feeds back the feedback signal Sf to an input end of the PFD 111 (Step S250). That is, the feedback signal Sf is related to the output signal So, and there is the feedback coefficient between the feedback signal Sf and the output signal So.

Under the correction of the loop bandwidth, the correcting circuit 130 modulates the feedback coefficient so that the feedback signal Sf and the reference signal Sr are unlocked (Step S260).

In some embodiments, the correcting circuit 130 includes a control unit 131, a switch SW, and a setting unit 133. The switch SW is bridged over the resistor R1. The control unit 131 is electrically connected to an output end of the frequency divider 119, a control end of the switch SW, and a control end of the setting unit 133. The setting unit 133 is electrically connected to a setting end of the frequency divider 119. During correction, the control unit 131 generates a selection signal Ns to control operation of the setting unit 133, and generates a switching signal EN to control operation of the switch SW.

Figure 3:
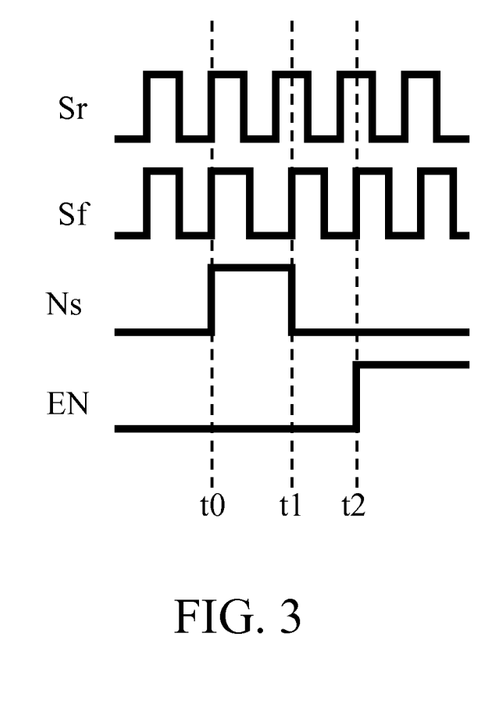
FIG. 3 is a sequence chart of a reference signal, a feedback signal, a selection signal, and a switching signal according to an embodiment.

With reference to FIG. 3, it is assumed that before the correction is performed, the divisor of the frequency divider 119 is N1. After the correction is started (time point t0), the setting unit 133 changes the divisor of the frequency divider 119 from N1 to N2 in response to the selection signal Ns until time point t1. At time point t1, the setting unit 133 switches the divisor from N2 back to N1 at time point t1. In this case, N1 is not equal to N2, and time point t0 is different from time point t1.

At time point t2, the switch SW is turned on (ON) according to the switching signal EN to short-circuit the resistor R1, so that the control voltage Vc generates an oscillation effect. Herein, time point t1 is different from time point t2. However, in some embodiments, time point t1 may also be the same as time point t2, that is, the divisor is switched back to N1 and the switch SW is turned on at the same time.

Figure 4:
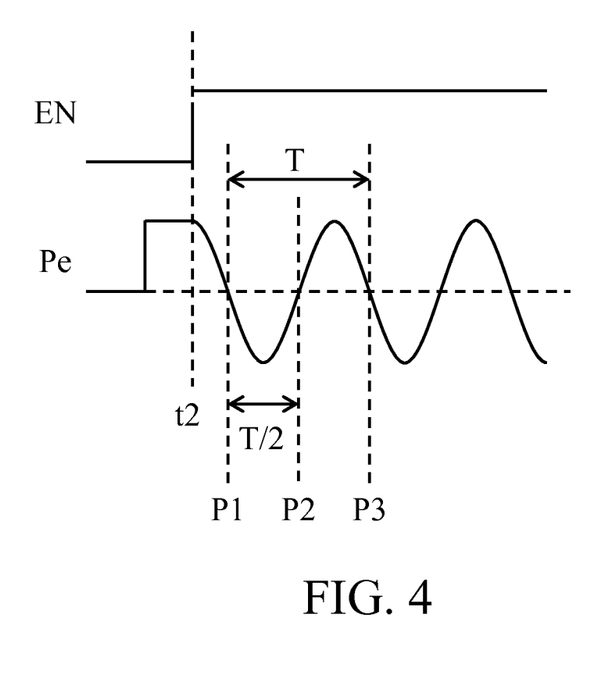
FIG. 4 is a sequence chart of a switching signal and a phase difference according to an embodiment.

Then, with reference to FIG. 4, the control unit 131 receives the reference signal Sr and the feedback signal Sf, and starts to detect a phase difference Pe between the reference signal Sr and the feedback signal Sf, so as to find two valid crossovers P1 and P2 (or P1 and P3) in the phase difference Pe (Step S270).

Herein, a time distance between a first valid crossover P1 and a second valid crossover P2 is half of a period (T/2), while a time difference between the first valid crossover P1 and a third valid crossover P3 is one period (T), that is, a time distance between two crossovers may be an integer multiple of half of a period (T/2). On this basis, the control unit 131 calculates an oscillation frequency of the phase difference Pe with the first valid crossover P1 and the second valid crossover P2 or with the first valid crossover P1 and the third valid crossover P3 (Step S280).

Figure 5:
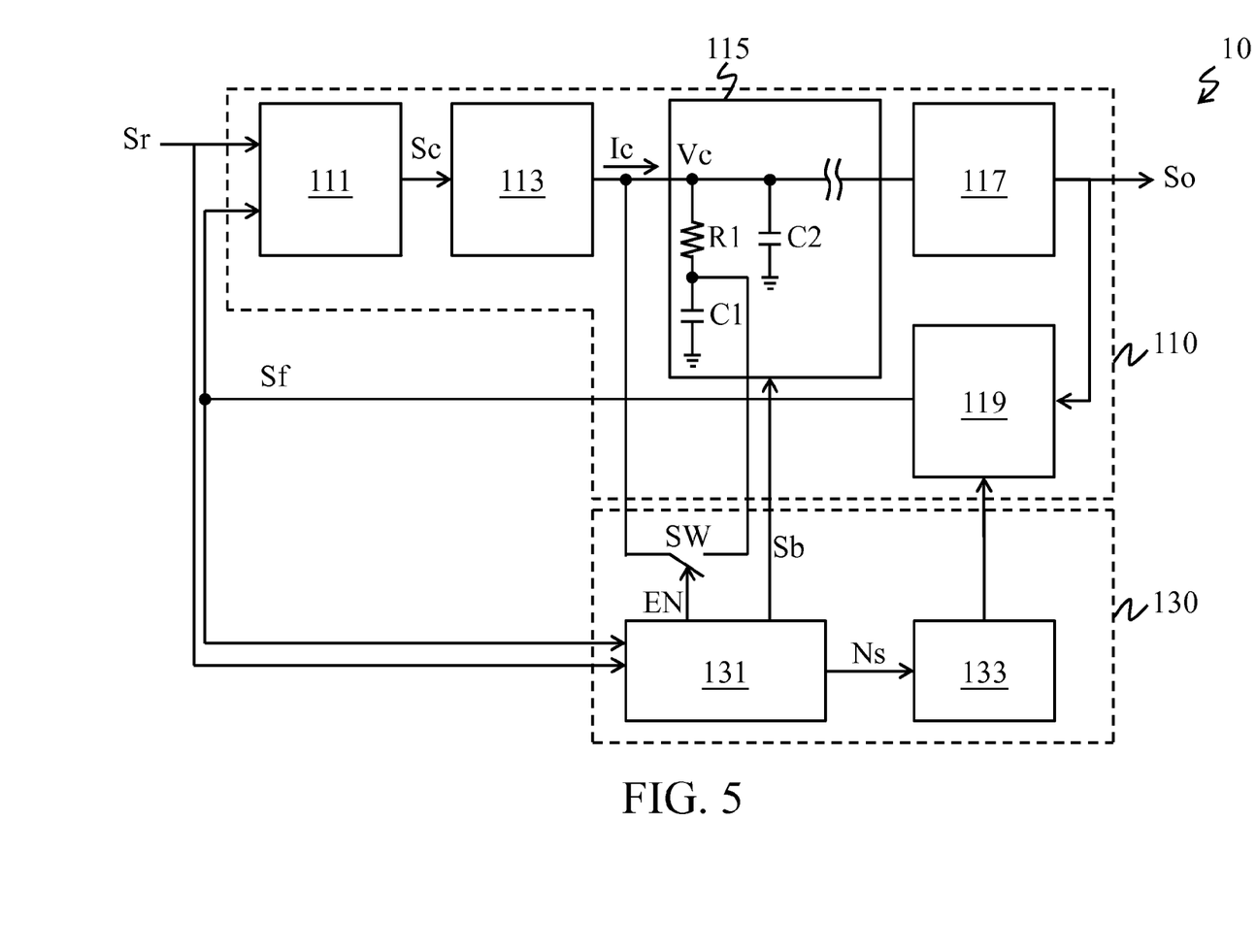
FIG. 5 is a schematic view of a PLL device according to a second embodiment of the present invention.
Figure 6:
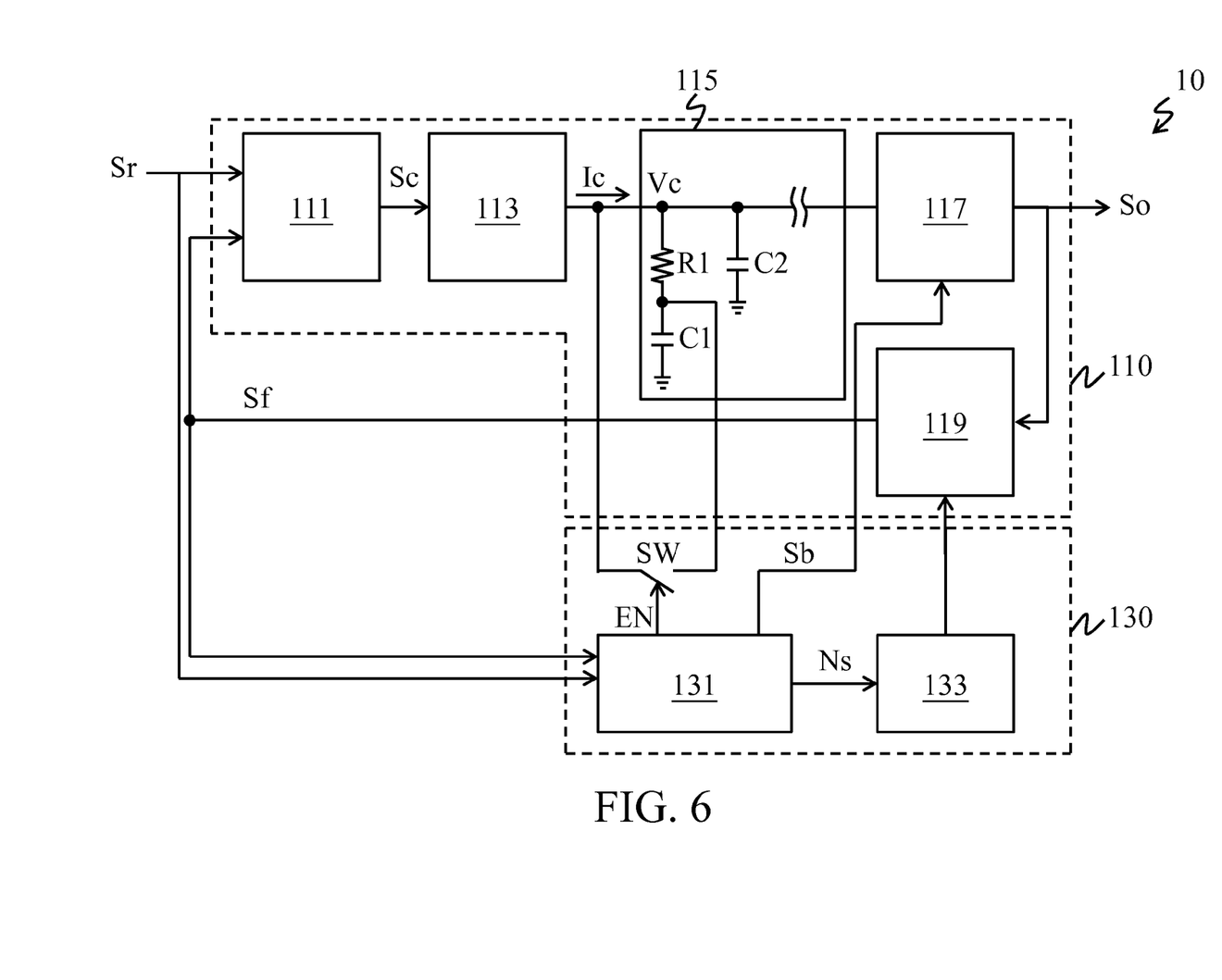
FIG. 6 is a schematic view of a PLL device according to a third embodiment of the present invention.

Then, the control unit 131 sets the control parameter, such as a charge-discharge current of the charge pump 113 (as shown in FIG. 1), filter capacitance of the capacitor C1 in the loop filter 115 (as shown in FIG. 5), or a gain of the VCO 117 (as shown in FIG. 6), of the PLL circuit 110 according to the oscillation frequency (Step S290).

In some embodiments, before correction, the control unit 131 first resets a control parameter with a set signal Sb which is set to a median value (Step S201).

Figure 7:
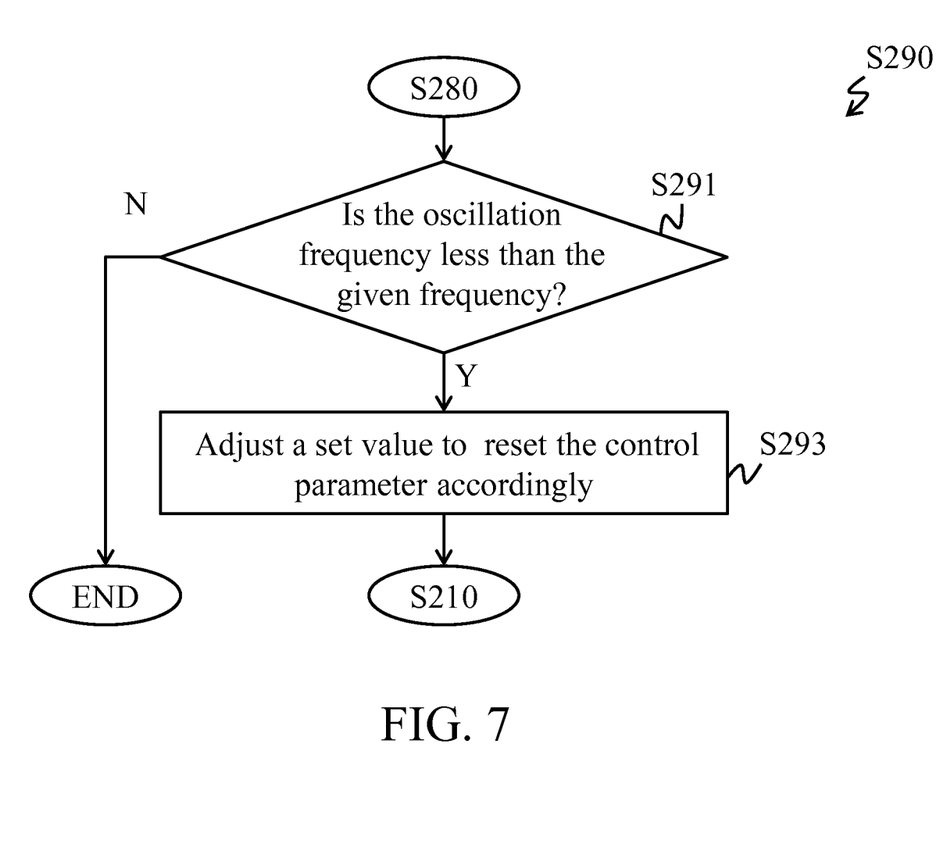
FIG. 7 is a detailed flowchart of Step S290 according to an embodiment.

In Step S290, referring to FIG. 7, the control unit 131 compares the oscillation frequency with a given frequency, to determine whether the oscillation frequency is less than the given frequency (Step S291).

When the oscillation frequency is less than the given frequency, it indicates that a transient response of the current loop bandwidth is excessively slow, and in this case, the control unit 131 correspondingly adjusts a set value and outputs a set signal Sb corresponding to the set value, so as to reset the control parameter accordingly (Step S293). After the resetting, steps are performed again (the process returns to Step S210 and continues) to confirm the correction result. Therefore, by repeatedly performing Step S210 to Step S290 for multiple times, the oscillation frequency is close or equal to the given frequency, thereby obtaining expected loop bandwidth. In some embodiments, preferably, steps are repeatedly performed for five times.

When the oscillation frequency is not less than the given frequency, it indicates that the transient response of the current loop bandwidth meets the expectation, and in this case, the control unit 131 completes a correction program. In some embodiments, when the transient response meets the expectation, steps may also repeatedly performed for multiple times, to make sure that the transient response meeting the expectation is a stable phenomenon.

Although the aforementioned given frequency is presented in the form of a single numerical value, the present invention is not limited thereto. In some embodiments, the given frequency may be a certain range formed by a first numerical value and a second numerical value (where the first numerical value is greater than the second numerical value). Then, in Step S291, the oscillation frequency is compared with the given range. When the oscillation frequency is greater than the first numerical value, it indicates that a transient response of the current loop bandwidth is excessively fast. When the oscillation frequency is smaller than the second numerical value, it indicates that the transient response of the loop bandwidth is excessively slow. When the oscillation frequency falls between the first numerical value and the second numerical value, it indicates that the transient response of the current loop bandwidth meets the expectation. When the transient response is excessively fast or slow, the control unit 131 correspondingly adjusts the set value to reset the control parameter.

Using the charge-discharge current of the charge pump 113 as an example, the control unit 131 sets the charge pump 113 by using a 5-digit binary set signal Sb.

The control unit 131 first outputs a set signal Sb, which is 10000, so as to set a current of the charge pump 113 to a median value (Step S201). When an oscillation frequency calculated by the control unit 131 is less than the given frequency (Step S291), the control unit 131 outputs a set signal Sb corresponding to "11000", so as to reset the current of the charge pump 113 (Step S293).

Figure 8:
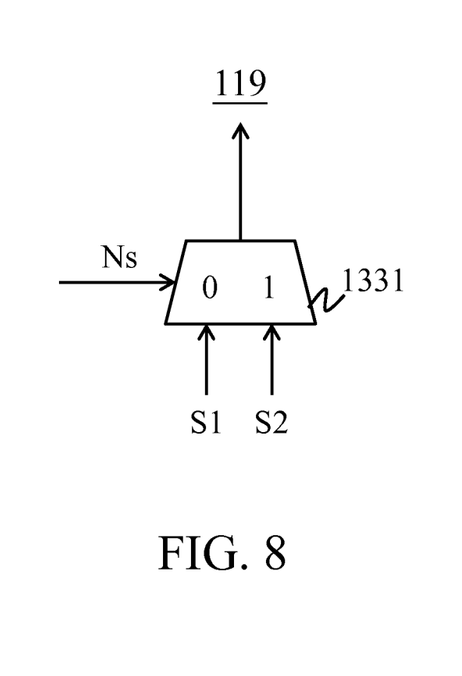
FIG. 8 is a schematic view of a setting unit according to an embodiment.

In some embodiments, the frequency divider 119 may perform integer frequency division, that is, the divisors N1 and N2 are integers. Referring to FIG. 8, the setting unit 133 includes a multiplexer 1331. Two input ends of the multiplexer 1331 receive a set signal S1 corresponding to the divisor N1 and a set signal S2 corresponding to the divisor N2, respectively. A control end of the multiplexer 1331 is electrically connected to the control unit 131, and an output end of the multiplexer 1331 is electrically connected to the frequency divider 119. The multiplexer 1331 selectively sends one of the set signals S1 and S2 to the control end of the frequency divider 119 according to the selection signal Ns, so as to determine whether the divisor of the frequency divider 119 is N1 or N2.

Figure 9:
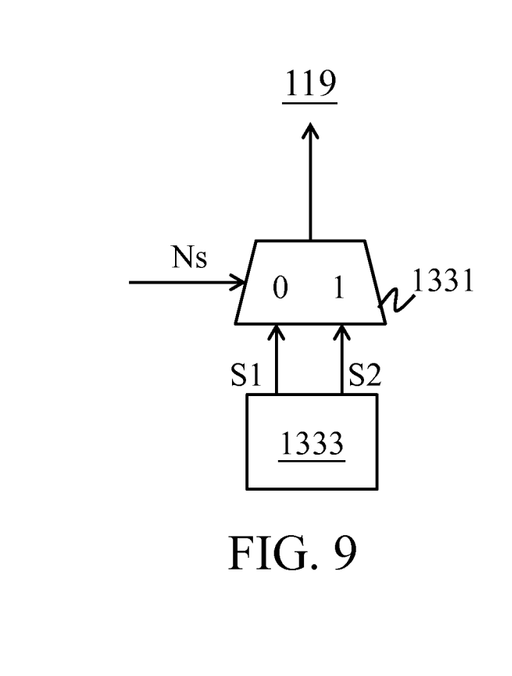
FIG. 9 is a schematic view of a setting unit according to another embodiment.

In some embodiments, the frequency divider 119 may perform fraction frequency division, that is, the divisors N1 and N2 are fractions. Referring to FIG. 9, the setting unit 133 includes a multiplexer 1331 and a sigma delta modulator (SDM) 1333. Two input ends of the multiplexer 1331 are electrically connected to the SDM 1333. A control end of the multiplexer 1331 is electrically connected to the control unit 131, and an output end of the multiplexer 1331 is electrically connected to the frequency divider 119.

The SDM 1333 provides the two input ends of the multiplexer 1331 with a set signal S1 corresponding to the divisor N1 and a set signal S2 corresponding to the divisor N2. The multiplexer 1331 selectively outputs one of the set signals S1 and S2 to the control end of the frequency divider 119 according to the selection signal Ns, so as to determine whether the divisor of the frequency divider 119 is N1 or N2.

Figure 10:
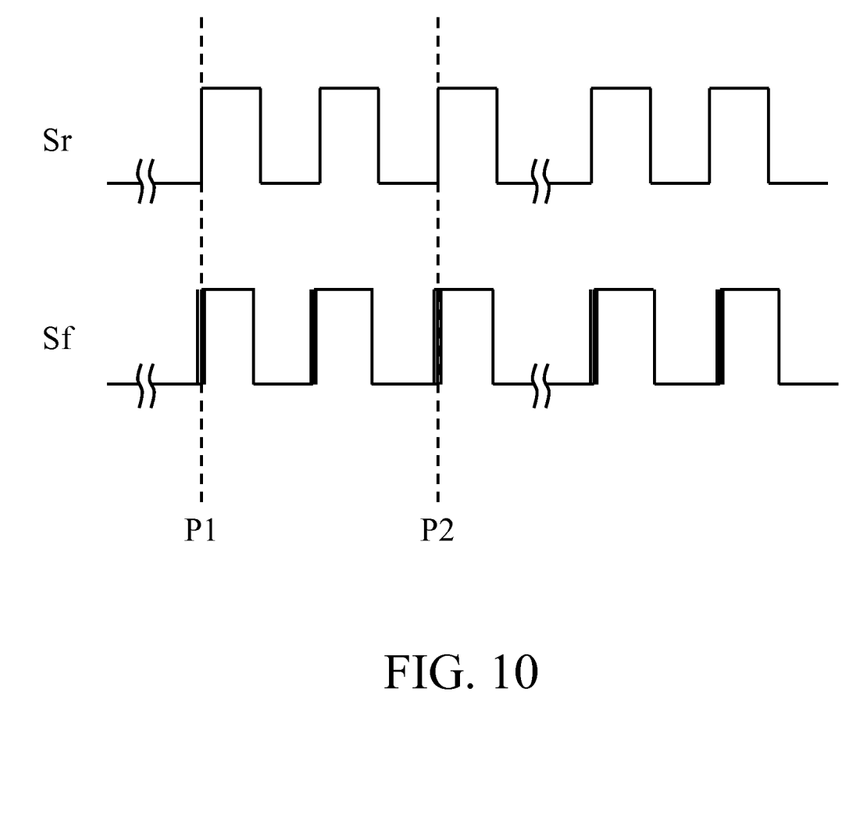
FIG. 10 is a sequence chart of a reference signal and a feedback signal according to another embodiment.

With the feedback of fraction frequency division, an edge of the feedback signal Sf jitters, as shown in FIG. 10. In this case, in Step S270, the control unit 131 detects crossovers in an oversampling manner to obtain each valid crossover. In other words, when detecting crossovers of the phase difference Pe, the control unit 131 starts to calculate the number of crossovers occurring consecutively (namely, two adjacent crossovers spaced by less than a given period of time). When a given number of crossovers occurring consecutively are detected, the control unit 131 determines that a valid crossover exists. In this case, the given number is preferably 10.

In other words, in an application to an integer-type PLL device 10, any crossover, detected by the control unit 131, of the phase difference Pe is a valid crossover. In an application to a fraction-type PLL device 10, it is determined that a valid crossover exists when the number of crossovers, detected by the control unit 131, occurring consecutively in the phase difference Pe reaches a given number.

Although a single-loop PLL device is used as an example for description in the foregoing embodiments, the present invention is not limited thereto. In some embodiments, the present invention is applicable to a multi-loop PLL device. In this case, it is assumed that the multi-loop PLL device includes a first loop and a second loop; a power switch is coupled between the second loop and a power supply, and it is unnecessary to set a switch SW that short-circuits a resistor R1. During correction, the power switch is turned off (Off) according to a switching signal, so as to stop operation of the second loop. At this time, operation of the first loop is the same as that of a single-loop PLL device, and then a correction program is performed.

In conclusion, the PLL device with correcting function of loop bandwidth and method thereof according to the present invention is applicable to various PLL apparatuses, to provide precise and digital loop bandwidth correction, and to be easily integrated in a single chip. The PLL device with correcting function of loop bandwidth and method thereof according to the present invention provides a correction technology that responds to a correction result, so as to avoid a performance change caused by related factors such as environmental conditions.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A phase lock loop (PLL) device with a correcting function of a loop bandwidth, comprising:
   a PLL circuit, for generating a control voltage according to a reference signal and a feedback signal, and generating an output signal according to the control voltage, wherein the feedback signal is related to the output signal, and there is a feedback coefficient between the feedback signal and the output signal; and
   a correcting circuit, for modulating the feedback coefficient to unlock the feedback signal and the reference signal, calculating an oscillation frequency according to two valid crossovers of a phase difference between the reference signal and the feedback signal, and adjusting a control parameter of the PLL circuit according to the oscillation frequency,
   wherein the PLL circuit comprises:
   a loop filter comprising:
      a resistor, for providing the control voltage; and
      a capacitor, electrically connected between the resistor and a ground; and
   wherein the correcting circuit comprises:
      a control unit, for calculating the oscillation frequency according to the two valid crossovers of the phase difference between the reference signal and the feedback signal and adjusting the control parameter according to the oscillation frequency;
      a switch, bridged over the resistor; and
      a setting unit, for setting the feedback coefficient;
   wherein the control unit is used for controlling the setting unit to modulate the feedback coefficient, and then controlling the switch to short-circuit the resistor, so that the control voltage occurs with an oscillation effect.

2. The PLL device with the correcting function of the loop bandwidth according to claim 1, wherein the two valid crossovers are spaced by a time distance that is a positive integer multiple of half of a period.

3. The PLL device with the correcting function of the loop bandwidth according to claim 1, wherein the feedback coefficient is an integer, and the setting unit comprises:
   a multiplexer, electrically connected to the control unit and the PLL circuit.

4. The PLL device with the correcting function of the loop bandwidth according to claim 1, wherein the feedback coefficient is a fraction, and the setting unit comprises:
   a multiplexer, electrically connected to the control unit and the PLL circuit; and
   a sigma delta modulator (SDM), electrically connected to the multiplexer.

5. The PLL device with the correcting function of the loop bandwidth according to claim 1, wherein the PLL circuit comprises a charge pump, a loop filter and a voltage controlled oscillator (VCO); and wherein the control parameter is at least one of a charge-discharge current of the charge pump, filter capacitance of the loop filter, and a gain of the VCO.

6. A method for correcting loop bandwidth, applied to a phase lock loop (PLL) circuit, comprising:

generating an output signal by the PLL circuit according to a reference signal and a feedback signal, wherein the feedback signal is related to the output signal, and there is a feedback coefficient between the feedback signal and the output signal;

modulating the feedback coefficient to unlock the feedback signal and the reference signal;

detecting two valid crossovers of a phase difference between the reference signal and the feedback signal;

calculating an oscillation frequency according to the two valid crossovers;

setting a control parameter of the PLL circuit according to the oscillation frequency; and short-circuiting a filter resistor of the PLL circuit.

7. The method for correcting loop bandwidth according to claim 6, wherein the two valid crossovers are spaced by a time distance that is a positive integer multiple of half of a period.

8. The method for correcting loop bandwidth according to claim 6, wherein the detecting the two valid crossovers comprises:

detecting a plurality of crossovers of the phase difference between the reference signal and the feedback signal in an oversampling manner to obtain each of the two valid crossovers.

9. The method for correcting loop bandwidth according to claim 6, wherein the feedback coefficient is a divisor of a frequency divider in the PLL circuit.

10. The method for correcting loop bandwidth according to claim 6, wherein the setting of the control parameter step comprises:

adjusting at least one of a charge-discharge current of the PLL circuit, a filter capacitance, and a gain of a voltage controlled oscillator (VCO) according to the oscillation frequency.

11. The PLL device with correcting function of loop bandwidth according to claim 1, wherein each of the valid crossovers is implemented by oversampling crossovers, and each of the crossovers is that the phase difference crosses a base level once.

12. The method for correcting loop bandwidth according to claim 6, wherein each of the valid crossovers is implemented by oversampling crossovers, and each of the crossovers is that the phase difference crosses a base level once.

* * * * *